(12) United States Patent
Van Den Berg

(10) Patent No.: US 7,033,126 B2
(45) Date of Patent: Apr. 25, 2006

(54) METHOD AND APPARATUS FOR LOADING A BATCH OF WAFERS INTO A WAFER BOAT

(75) Inventor: Jannes Remco Van Den Berg, Emmeloord (NL)

(73) Assignee: ASM International N.V., Bilthoven (NL)

( * ) Notice: Subject to any disclaimer, the term of this patent is extended or adjusted under 35 U.S.C. 154(b) by 406 days.

(21) Appl. No.: 10/406,801

(22) Filed: Apr. 2, 2003

(65) Prior Publication Data

US 2004/0197174 A1 Oct. 7, 2004

(51) Int. Cl.
*B65G 49/07* (2006.01)

(52) U.S. Cl. .......................... 414/416.03; 414/416.08; 414/937; 414/941

(58) Field of Classification Search ........... 414/416.03, 414/416.08, 937, 941
See application file for complete search history.

(56) References Cited

U.S. PATENT DOCUMENTS

| | | | |
|---|---|---|---|
| 4,407,654 A | 10/1983 | Irwin | |
| 4,770,590 A | 9/1988 | Hugues et al. | |
| 4,923,054 A * | 5/1990 | Ohtani et al. | 187/267 |
| 5,162,047 A | 11/1992 | Wada et al. | |
| 5,192,371 A | 3/1993 | Shuto et al. | |
| 5,219,079 A | 6/1993 | Nakamura | |
| 5,310,339 A | 5/1994 | Ushikawa | |
| 5,316,472 A | 5/1994 | Niino et al. | |
| 5,334,257 A | 8/1994 | Nishi et al. | |
| 5,407,449 A | 4/1995 | Zinger | |
| 5,482,558 A | 1/1996 | Watanabe et al. | |
| 5,482,559 A | 1/1996 | Imai et al. | |
| 5,492,229 A | 2/1996 | Tanaka et al. | |
| 5,556,147 A | 9/1996 | Somekh et al. | |
| 5,556,275 A | 9/1996 | Sakata et al. | |
| 5,565,034 A * | 10/1996 | Nanbu et al. | 118/668 |
| 5,664,925 A | 9/1997 | Muka et al. | |
| 5,820,367 A | 10/1998 | Osawa | |
| 5,858,103 A | 1/1999 | Nakajima et al. | |
| 5,865,321 A | 2/1999 | Tomanovich | |
| 5,897,311 A | 4/1999 | Nishi | |
| 5,931,666 A | 8/1999 | Hengst | |
| 5,974,682 A | 11/1999 | Akimoto | |
| 5,984,607 A * | 11/1999 | Oosawa et al. | 414/222.06 |
| 6,034,000 A | 3/2000 | Heyder et al. | |
| 6,062,853 A * | 5/2000 | Shimazu et al. | 432/258 |

(Continued)

FOREIGN PATENT DOCUMENTS

EP 86308980.1 11/1986

(Continued)

*Primary Examiner*—Thomas J. Brahan
(74) *Attorney, Agent, or Firm*—Knobbe, Martens, Olson & Bear, LLP

(57) ABSTRACT

A receiver frame loads and unloads a batch of semiconductor wafers onto wafer holders in a wafer boat. The wafer holders extends continuously about the perimeter of an overlying wafer. The receiver frame is provided with a plurality of supporting arms which are immovably mounted to a vertically extending structure. The supporting arms are coaxially aligned and vertically spaced in a manner corresponding with the spacing of the wafer holders in the wafer boat. Each supporting arm is configured to be accommodated below a support ring, with its distal end extending to align with the center region of the wafer holder. The distal end of each supporting arm is provided with at least three support pins to support a wafer vertically spaced above a wafer holder. To load wafers onto the wafer holders, after placing the wafers upon the support pins, the wafer holders are moved above the support pins so that the wafer holders contact and lift the wafers off the support pins.

33 Claims, 11 Drawing Sheets

U.S. PATENT DOCUMENTS

| | | |
|---|---|---|
| 6,099,302 A | 8/2000 | Hong et al. |
| 6,111,225 A | 8/2000 | Ohkase et al. |
| 6,203,617 B1 | 3/2001 | Tanoue et al. |
| 6,204,194 B1 * | 3/2001 | Takagi ................ 438/758 |
| 6,216,883 B1 | 4/2001 | Kobayashi et al. |
| 6,287,112 B1 | 9/2001 | Van Voorst Vader et al. |
| 6,321,680 B1 | 11/2001 | Cook et al. |
| 6,341,935 B1 | 1/2002 | Tseng |
| 6,361,313 B1 | 3/2002 | Beyaert et al. |
| 6,368,049 B1 * | 4/2002 | Osaka et al. ............ 414/783 |
| 6,390,753 B1 | 5/2002 | De Ridder |
| 6,464,445 B1 | 10/2002 | Knapik et al. |
| 2002/0182892 A1 | 12/2002 | Arai et al. |

FOREIGN PATENT DOCUMENTS

| | | |
|---|---|---|
| JP | 61247678 | 10/1986 |
| JP | 10-163297 * | 6/1998 |
| WO | WO 00/68977 | 5/2000 |

\* cited by examiner

METHOD AND APPARATUS FOR LOADING A BATCH OF WAFERS INTO A WAFER BOAT

FIELD OF THE INVENTION

This invention relates generally to semiconductor fabrication and, more particularly, to a method and apparatus for loading or unloading a wafer boat that accommodates a plurality of semiconductor wafers.

BACKGROUND OF THE INVENTION

A wafer boat is typically used to hold a plurality of semiconductor wafers for processing in conventional vertical heat treatment apparatus. The wafer boat commonly comprises a plurality of support accommodations that support the wafers at edge portions of those wafers. In this way, the wafers are held oriented horizontally in a vertically spaced manner. In general, wafers are automatically loaded from a wafer container into a boat using a generic wafer handler, such as by contacting the wafer at its backside or bottom surface, with an end effector.

For high ramp rate heat treatment processes and CVD processes, each support accommodation may comprise a wafer holder that underlies an entire perimeter of a wafer. Such a wafer holder can be a plate or can be in the shape of a ring. Such a wafer holder helps to minimize non-uniformities in the temperature distribution on the surface of a wafer supported on that wafer holder and, desirably, thereby minimizes non-uniformities in the thickness of various films formed on the wafer or non-uniformities of other high temperature treatment effects.

Automatically loading wafers into a wafer boat having wafer holders that extend in an unbroken line around an entire perimeter of a wafer is problematic, because generic wafer handlers are typically not able to load a wafer onto such wafer holders. For example, generic wafer handlers typically carry a wafer on an end effector, which typically contacts a wafer at its edges or at a central area in the wafer's backside. In order to seat a wafer onto a wafer holder, the end effector typically must pass through the outer perimeter of the wafer holder to center and set the wafer on the wafer holder. Wafer holders that are plates or complete rings, however, do not have breaks or openings in their perimeters to allow end effectors to pass into their centers and, so, prevent the end effectors from being able to center and place wafers upon the wafer holders. To solve this specific problem, several loading apparatuses and methods have been suggested in the prior art.

In U.S. Pat. No. 5,162,047 to Wada et al., a method and wafer transfer apparatus is described for transferring wafers one-by-one from a wafer cassette to a wafer boat having wafer holders that are complete rings. The wafer transfer apparatus comprises a lower assembly and an upper assembly. The lower assembly has a lift mechanism to vertically move the upper assembly. The upper assembly has mounted on it an upper slider and a lower slider, each moveable in a horizontal direction. A receiver, provided with support pins, is attached to the distal end of the lower slider and a conveying arm is attached to the distal end of the upper slider. The receiver attached to the lower slider is vertically movable.

FIG. 1 shows the method described by Wada et al. for transferring a semiconductor wafer 300 from a wafer cassette (not shown) to a support ring 302 in a wafer boat (not shown). First, a semiconductor wafer is picked-up, in a substantially horizontal state, from the wafer cassette by the conveying arm 304, and positioned above a support ring 302 inside the vertical boat, as shown in FIG. 1A. Subsequently, the receiver 306 is positioned below the support ring 302, and then moved upwardly to a position where support pins 308 of the receiver 306 reach the conveying arm 304 through an central opening 310 in the support ring 302, as shown in FIG. 1B. The wafer 300 is lifted from the conveying arm by the support pins 308. Next, the conveying arm 304 is retracted from the boat, as shown in FIG. 1C. Finally, the receiver 306 is moved downwardly to a position where the wafer 306 is transferred to the support ring 302, and the receiver 300 is also retracted from the boat, as shown in FIG. 1D. Progressing from one wafer holder 302 to another, the sequence of events described above is repeated until the wafer boat is fully loaded with wafers 300. Unloading of the wafers 300 from the wafer boat can be performed by the reverse of the procedure described above.

A disadvantage of this method is that the time required to execute the movements of the receiver must be added to the wafer transfer time. Because the wafers are both transferred to the wafer boat one at a time and also seated upon the wafer holders one at a time, the total time to load or unload a boat is significant. To reduce the loading/unloading time per batch treatment cycle, Wada et al. suggest converting the wafer transfer apparatus into an apparatus in which two or more semiconductor wafers can be transferred simultaneously. The apparatus consists of a multistage arrangement of identical apparatuses to transfer a plurality of wafers. While this can lead to some reduction of the loading/unloading time per batch treatment cycle, it is, undesirably, a costly solution involving a complex wafer transfer apparatus.

Another apparatus for simultaneously transferring two or more wafers into a wafer boat having ring-type wafer holders is described in U.S. Pat. No. 5,334,257 to Nishi et al. As shown in FIG. 2, Nishi et al. describes a wafer boat 200 that comprises a plurality of fixed ring-shaped wafer holders 202. Each ring-shaped wafer holder 202 is provided with at least three cutout sections 204 located at the outer edge of the ring 202. The cutouts are of a size and shape sufficiently large to allow passage of supporting teeth 206, which can temporarily hold wafers (not shown) inside the wafer boat 200 over the fixed wafer holders 202. The supporting teeth 206 are provided at the distal ends of supporting arms 208, which are in turn mounted to a supporting tooth drive device 210. Each of the supporting teeth 206 can freely enter and leave one of the cutout sections 204 by moving in a horizontal direction A, B, or C, respectively. In order to load a plurality of wafers at one time in the wafer boat 200, Nishi suggests in an alternative embodiment to provide each supporting arm 208 at its distal end not with only a single support tooth 206 but with a support comb (not shown), which comprises a plurality of vertically spaced apart support teeth 206 with vertical spacing corresponding with the spacing of the wafer holders 202 along the height of the wafer boat. Using the support comb with the plurality of support teeth 206, it is possible to load up to 30 semiconductor wafers (not shown) at one time in the wafer boat 200.

Batch-wise loading of the wafer boat comprises the following steps. First, the support comb is inserted into the cutouts such that the support teeth 206 are positioned for supporting the wafers (not shown) spaced above the wafer holders 202, without touching the wafer holders 202. Then the wafers are transferred from a wafer cassette 212 to a position inside the wafer boat using a fork-shaped transfer device 214, shown schematically. The supporting teeth 206 temporarily support the wafers above the wafer holders 202, without touching the wafer holders 202. After the capacity of the support comb is reached, e.g., after a maximum of 30 wafers is supported on the support teeth 206, the wafers are loaded onto the ring-shaped wafer holders 202 by changing the vertical position of the wafer boat 200 relative to the supporting teeth 206. By raising the boat 200 while the support teeth 206 remain stationary, the support comb is shifted in a downward direction relative to the wafer holders 202. By this movement, each support tooth 206 passes below a wafer support surface of the wafer holder 202 and the wafer above it is handed off onto the wafer holder 202. Depending on the number of wafer accommodations in a wafer boat 200 and the number of support teeth 206, a boat 200 can be completely loaded by performing this procedure one or more times. Unloading of the wafers from the wafer boat 200 can be accomplished by performing the reverse of the procedure described above.

Although the apparatus described by Nishi et al. leads to a reduction in the exchange time per treatment cycle, its implementation is undesirably complex and space consuming. Furthermore, it requires cut-out 204 at the outer perimeters of the wafer holders for the teeth 206. These cut-outs 204 leave exposed parts of the backside of wafers seated upon the wafer holders 202 and, so, may cause temperature non-uniformities in the wafers and may also influence the quality of layers deposited on those wafers.

Accordingly, it is an object of the present invention to provide an apparatus and method capable of efficiently loading a plurality of wafers into a wafer boat having wafer holders that support an entire perimeter of each of the plurality of wafers.

SUMMARY OF THE INVENTION

In accordance with one preferred embodiment of the invention, a system for transferring a plurality of semiconductor wafers is provided. The system includes a vertical wafer boat having a plurality of wafer holders. Each of the wafer holders is vertically spaced apart and is configured to extend continuously around a perimeter of one of the plurality of wafers when the wafer is seated upon the wafer holder. A wafer handler with an end effector is also provided for moving wafers. The system also includes a receiver frame comprising a plurality of supporting arms fixed to a vertically extending structure. Each of the supporting arms comprises a wafer support structure which is configured to support one of the plurality of wafers while vertically separating the wafer from a wafer holder directly below the wafer. Additionally, the height and spatial arrangement of the wafer support structure is sufficient to allow the end effector to contact a bottom surface of the wafer without the end effector contacting either the wafer holder or the wafer support structure. The system also includes a transfer mechanism capable of moving the wafer boat and the receiver frame relative to each other from a spaced-apart position to a wafer transfer position. Each supporting arm, including its wafer support structure, is sized and vertically spaced from other supporting arms such that the plurality of supporting arms can be accommodated between the plurality of wafer holders, each supporting arm accommodated directly below a wafer holder.

In accordance with another preferred embodiment, an apparatus is provided for transferring a plurality of semiconductor wafers to a wafer boat having a plurality of wafer holders. The apparatus comprises a vertically extending structure and a plurality of horizontally extending supporting arms attached to the vertically extending structure. The supporting arms are sized and vertically spaced to fit between adjacent wafer holders in the wafer boat and each of the plurality of supporting arms is immovable relative to the other of the plurality of supporting arms. In addition, a wafer support structure extends upwardly from each of the supporting arms. Each of the plurality of wafer support structures is capable of extending upwardly through a central region of one of the plurality of wafer holders in the wafer boat and capable of supporting one of the plurality of semiconductor wafers directly above the wafer holder while the wafer support structure is extended upwardly through the central region.

In accordance with yet another embodiment, a method of transferring semiconductor wafers between a wafer cassette and a wafer boat is provided. The method comprises providing a wafer boat having a plurality of wafer holders for supporting wafers during semiconductor processing and providing a receiver frame having a plurality of supporting arms. Each supporting arm is immovable relative to the other of the plurality of supporting arms and is provided proximate its distal end with a wafer support structure to support a wafer. The wafer support structure is configured to allow the wafer supported by the wafer support structure to be contacted by an end effector at a bottom surface of the wafer without the end effector contacting the wafer support structure or any of the plurality of wafer holders. The method further includes horizontally moving the wafer boat and the receiver frame relative to each other to place each of the plurality of supporting arms between adjacent pairs of wafer holders and to approximately align the wafer support structures with the center of a directly overlying wafer holder. The top surface of the wafer support structure of each supporting arm is then positioned above the wafer holder directly overlying the supporting arm and a wafer from the wafer cassette is placed onto one of the wafer support structure. The wafer is lifted using the wafer holder by vertically shifting the wafer boat and the receiver frame relative to each other. Then the wafer boat is distanced from the receiver frame.

In accordance with another preferred embodiment, a method is provided for transferring semiconductor wafers. The method comprises providing at least two wafers in a wafer cassette, at least two wafer holders in a wafer boat, at least two horizontally extending arms, and a wafer handler. The method further comprises horizontally inserting the arms into the wafer boat and also inserting each of the wafers into the wafer boat above one of the wafer holders using the wafer handler, wherein the wafer and the arms are each inserted into the wafer boat from a different direction relative to each other. After being inserted into the wafer boat, each of the wafers is supported above and vertically separated from the wafer holder with one of the arms. Each of the wafers is then seated upon one of the wafer holders by simultaneously lowering each of the horizontally extending arms relative to the wafer holders. Each of the wafer holders extends continuously around a perimeter of one of the wafers seated upon the wafer holder.

In accordance with yet another embodiment, a method is provided for loading a plurality of wafers onto a plurality of wafer holders in a vertical wafer boat. The method comprises positioning each of the plurality of wafers above one of the plurality of wafer holders. After positioning, the plurality of wafers is supported vertically separated from each of the plurality of wafer holders. Subsequently, each of the plurality of wafers is seated upon one of the plurality of wafer holders by raising the wafer boat. After being seated, each of the plurality of wafer holders supporting a wafer extends continuously around an outer edge of the wafer.

BRIEF DESCRIPTION OF THE DRAWINGS

The invention will be better understood from the detailed description of hte preferred embodiments and from the appended drawings, which are meant to illustrate and not to limit the invention, and wherein.

DETAILED DESCRIPTION OF THE PREFERRED EMBODIMENT

According to preferred embodiments of the invention, a receiver frame is provided for loading a plurality of semiconductor wafers into a wafer boat having a plurality of wafer holders. The receiver frame includes a plurality of horizontally extending arms attached to a vertically extending structure. Each of the arms of the receiver frame has an upwardly extending wafer support structure for supporting a wafer. The arms are not independently movable relative to each other. For loading the plurality of wafers, each of the arms is positioned between adjacent pairs of wafer holders in the wafer boat and the wafers are temporarily supported by the wafer support structure. By moving the wafer boat and the receiver frame relative to each other, the wafers are handed off from the wafer support structures to the wafer holders.

Figure 6:
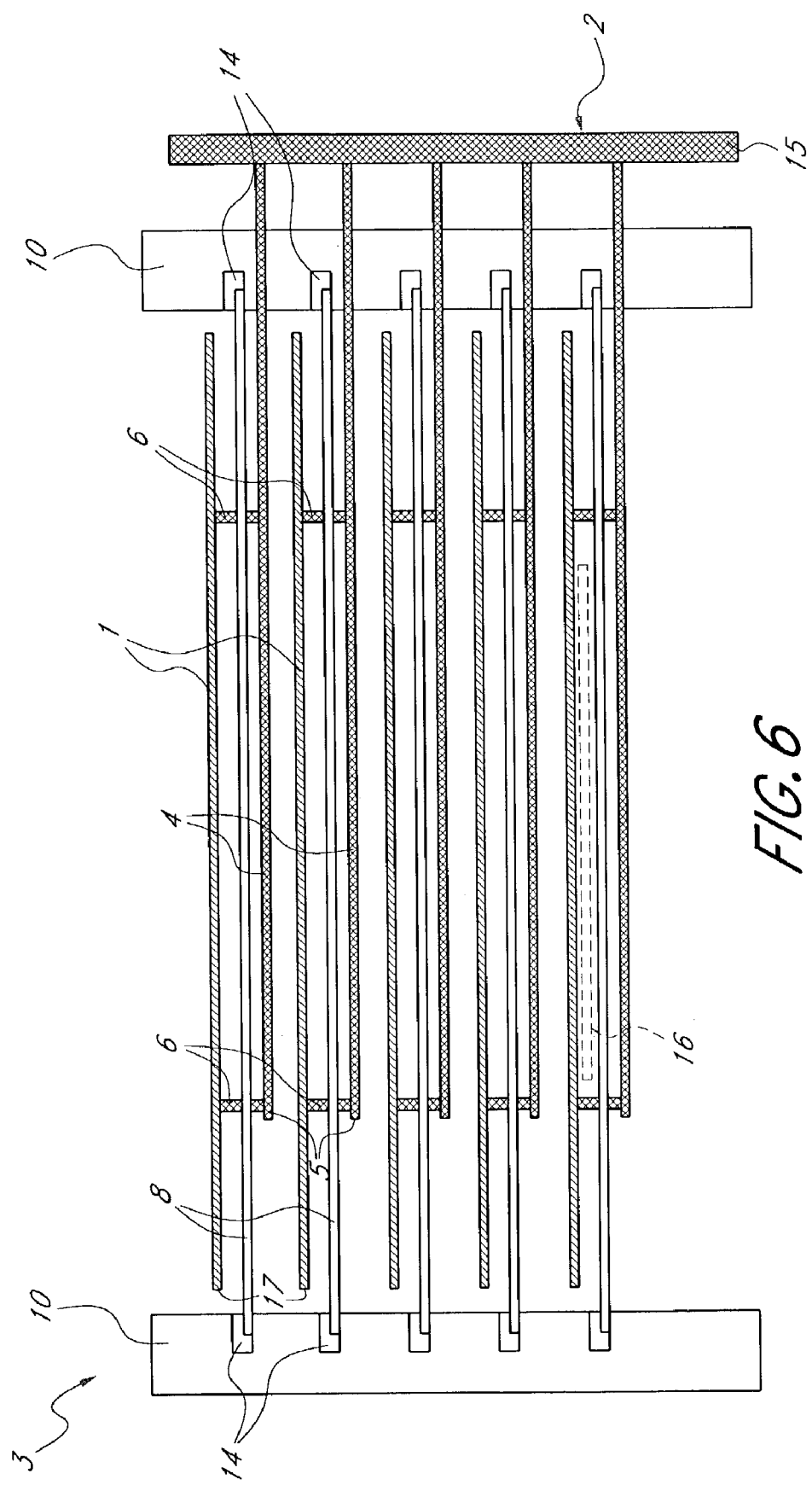
FIG. 6 is a cross-sectional side view of the receiver frame and wafer boat of FIG. 3, wherein each supporting arm now supports a semiconductor wafer on its support pins.
Figure 7:
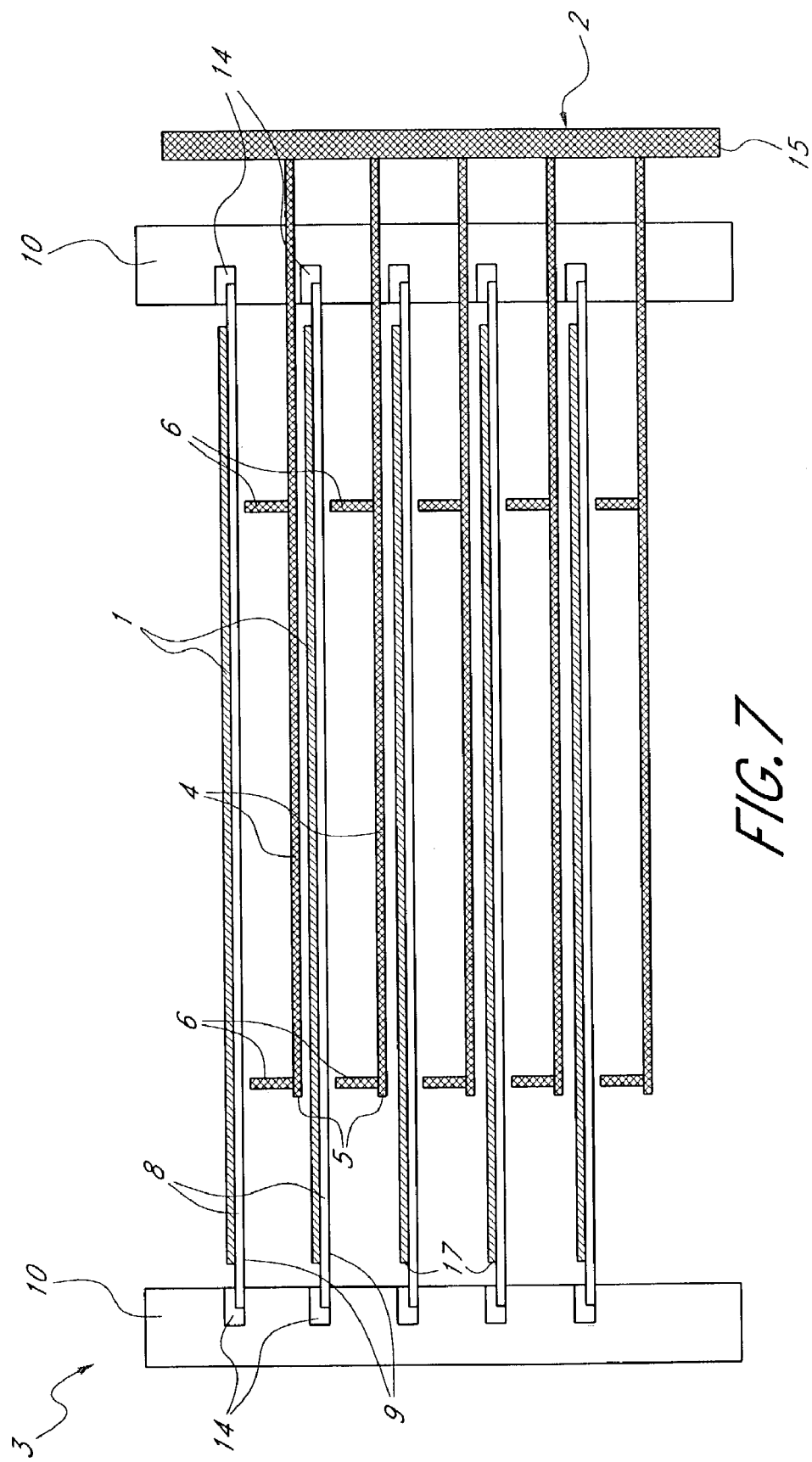
FIG. 7 is a cross-sectional side view of the receiver frame, wafer boat and wafer of FIG. 6, wherein the receiver frame is moved downwards relative to the wafer holders so that the semiconductor wafers are now supported by the wafer holders.

Reference will now be made to the drawings wherein like numerals refer to like parts throughout. The order of events for the batch-wise loading of semiconductor wafers onto wafer holders is illustrated in FIGS. 3, 6 and 7, respectively.

Figure 1A:
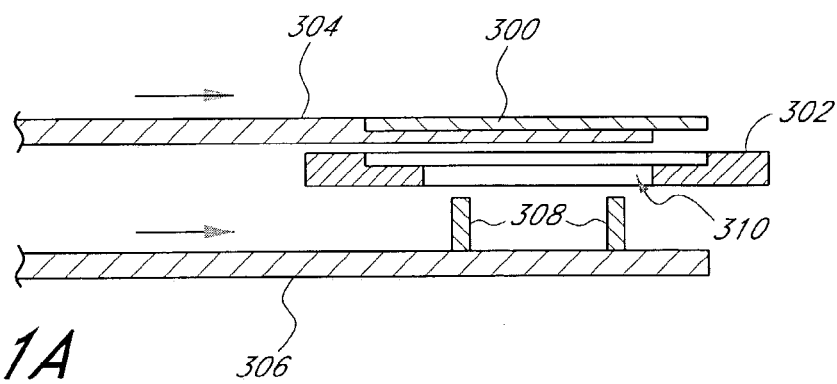
FIGS. 1A–1D are cross-sectional side views of a wafer exchange apparatus according to the prior art, the sequence of FIGS. 1A–1D illustrating the sequence of events for loading a semiconductor wafer unto a ring-shaped wafer holder.
Figure 1B:
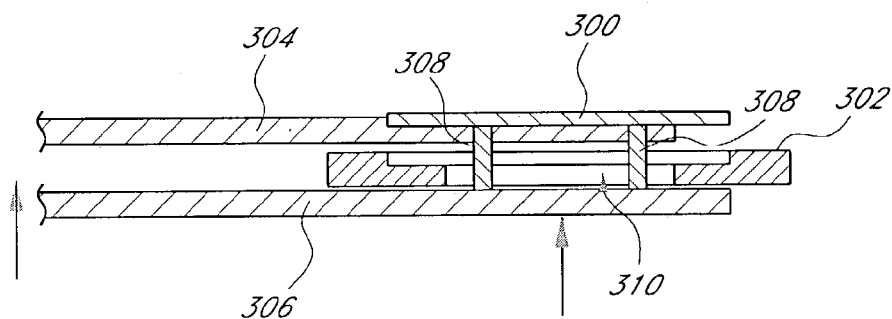
Figure 1C:
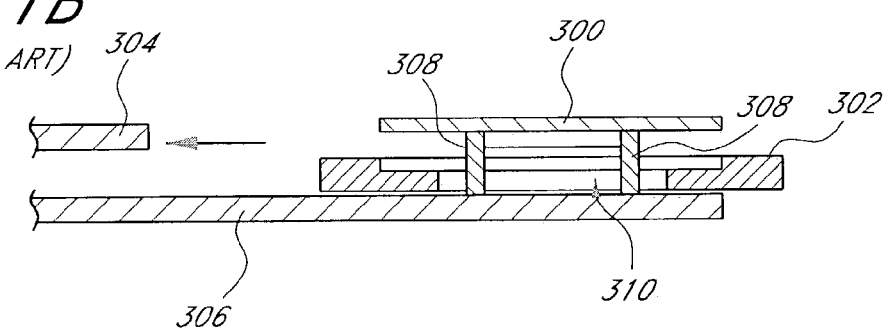
Figure 1D:
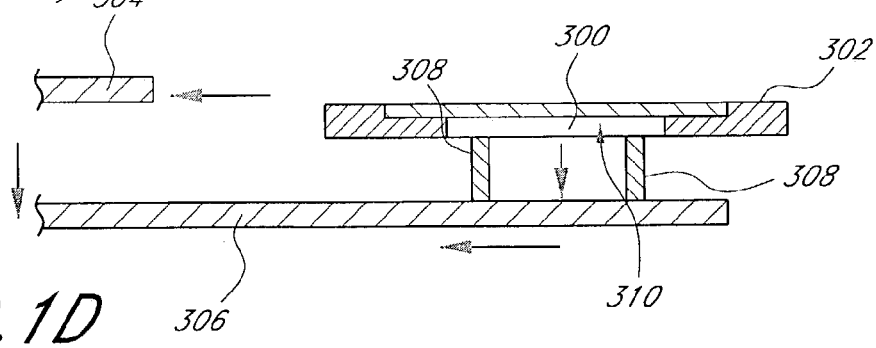
Figure 2:
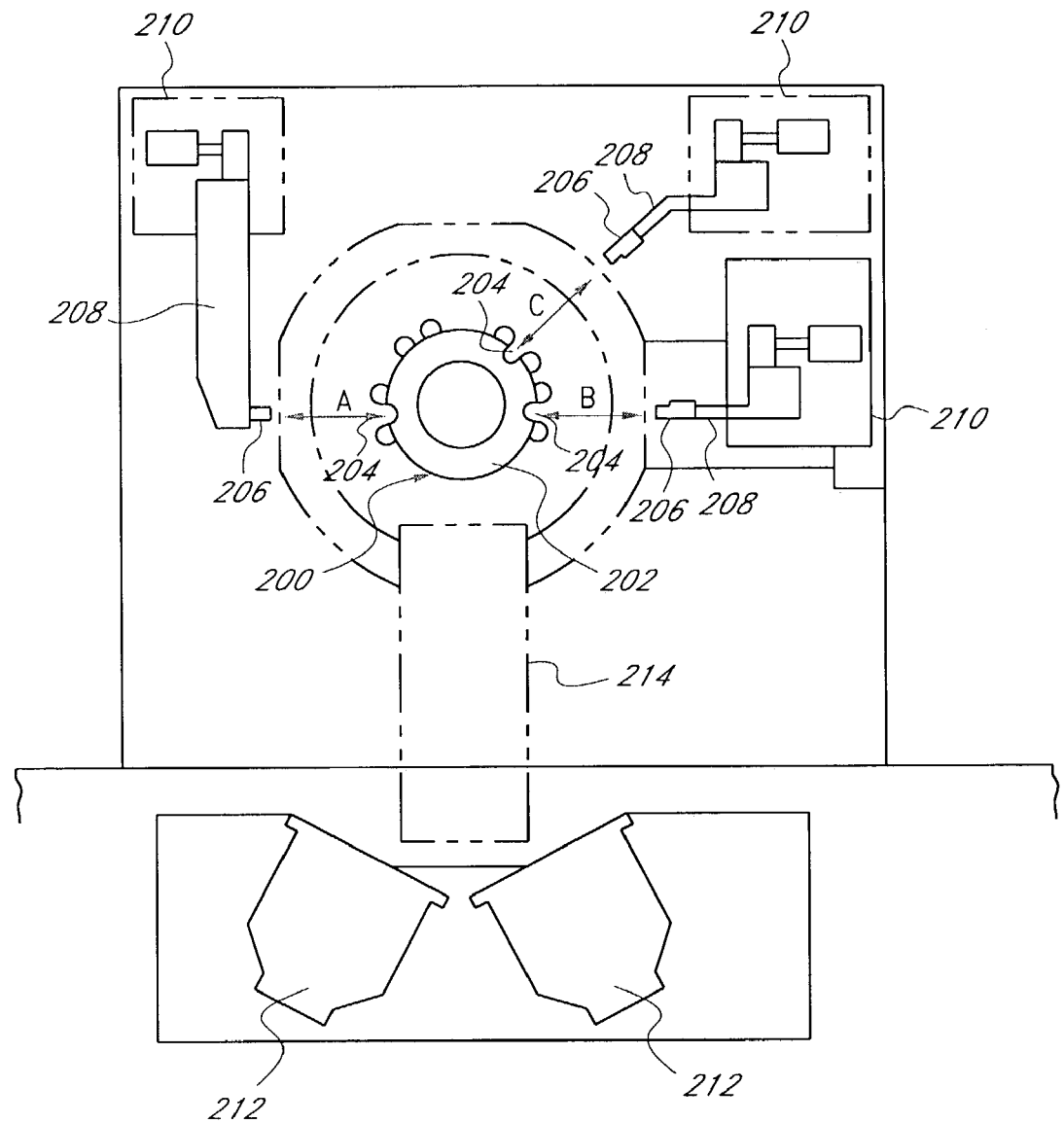
FIG. 2 is a cross-sectional top view of a heat treatment system according to the prior art, the system comprising a supporting teeth device for transferring a plurality of semiconductor wafers onto ring-shaped wafer holders.
Figure 3:
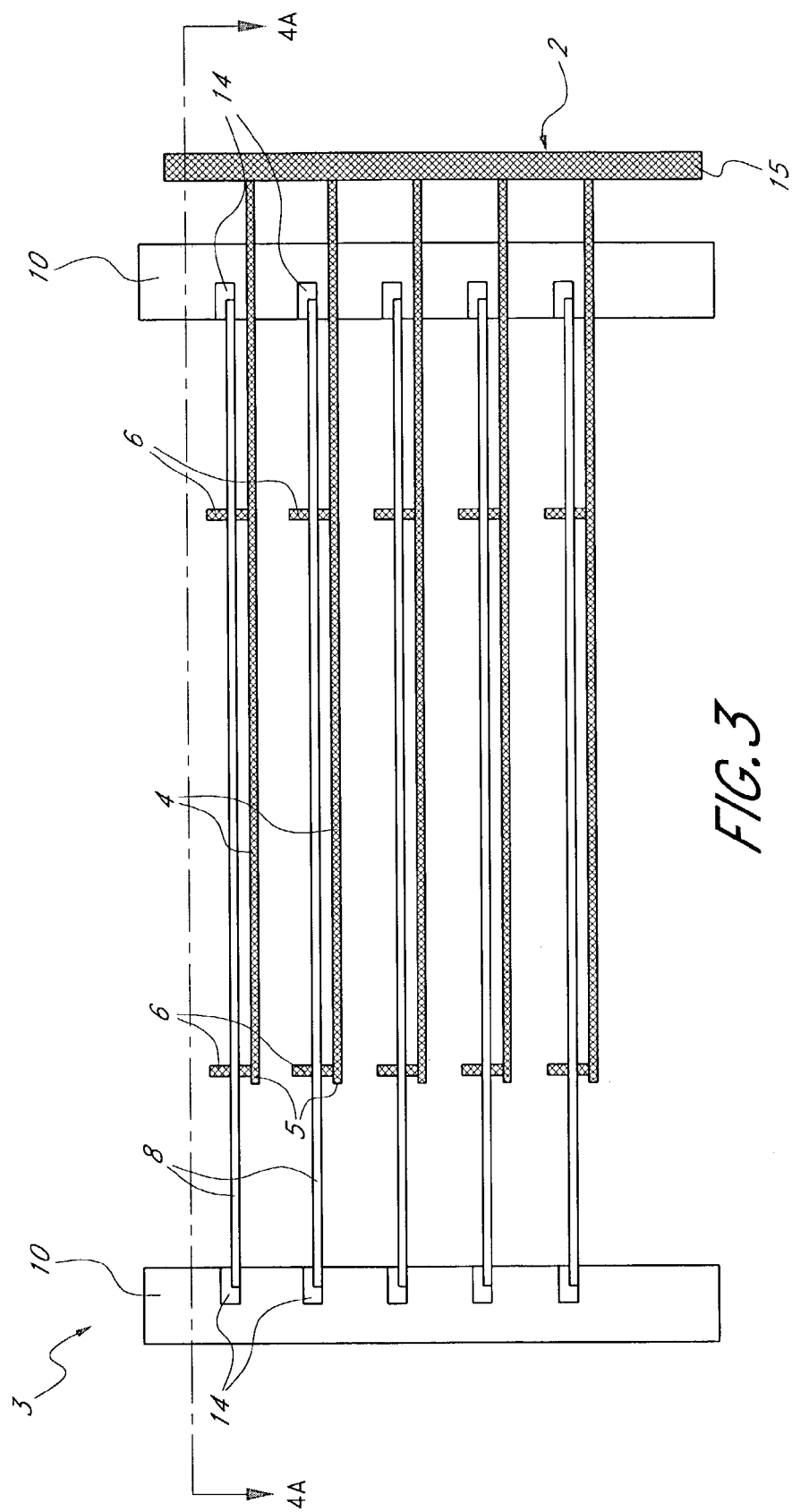
FIG. 3 is a cross-sectional side view of a part of a receiver frame and a wafer boat in a wafer transfer position, according to preferred embodiments of the invention.

FIG. 3 is a cross-sectional side view of a receiver frame 2 shown together with a wafer boat 3 at a wafer transfer position. The boat 3 preferably comprises three or more vertical extensions that extend the height of the wafer boat 3 and that can hold a plurality of wafer holders in a vertically spaced-apart arrangement. In the illustrated embodiment, the extensions comprise three or more rods 10, each rod 10 preferably being provided with a plurality of accommodations 14, each accommodation 14 configured to accommodate a wafer holder 8. In other arrangements having more than three rods 10, it will be appreciated that not every rod 10 need be provided with support accommodations 14, although, preferably, at least three rods 10 are provided with support accommodations 14. Advantageously, having at least three rods 10 with support accommodations 14 allows the support accommodations 14 to define a plane and, so, to more stably accommodate a wafer holder 8. It will also be appreciated that while the rods 10 are shown provided with support accommodations 14 that are cut-outs or recesses in the rods 10, in other embodiments the support accommodations can be protrusions (not shown) that project horizontally from the vertical extensions. All of the accommodations 14 within a given plane define a wafer holder slot.

Figure 4A:
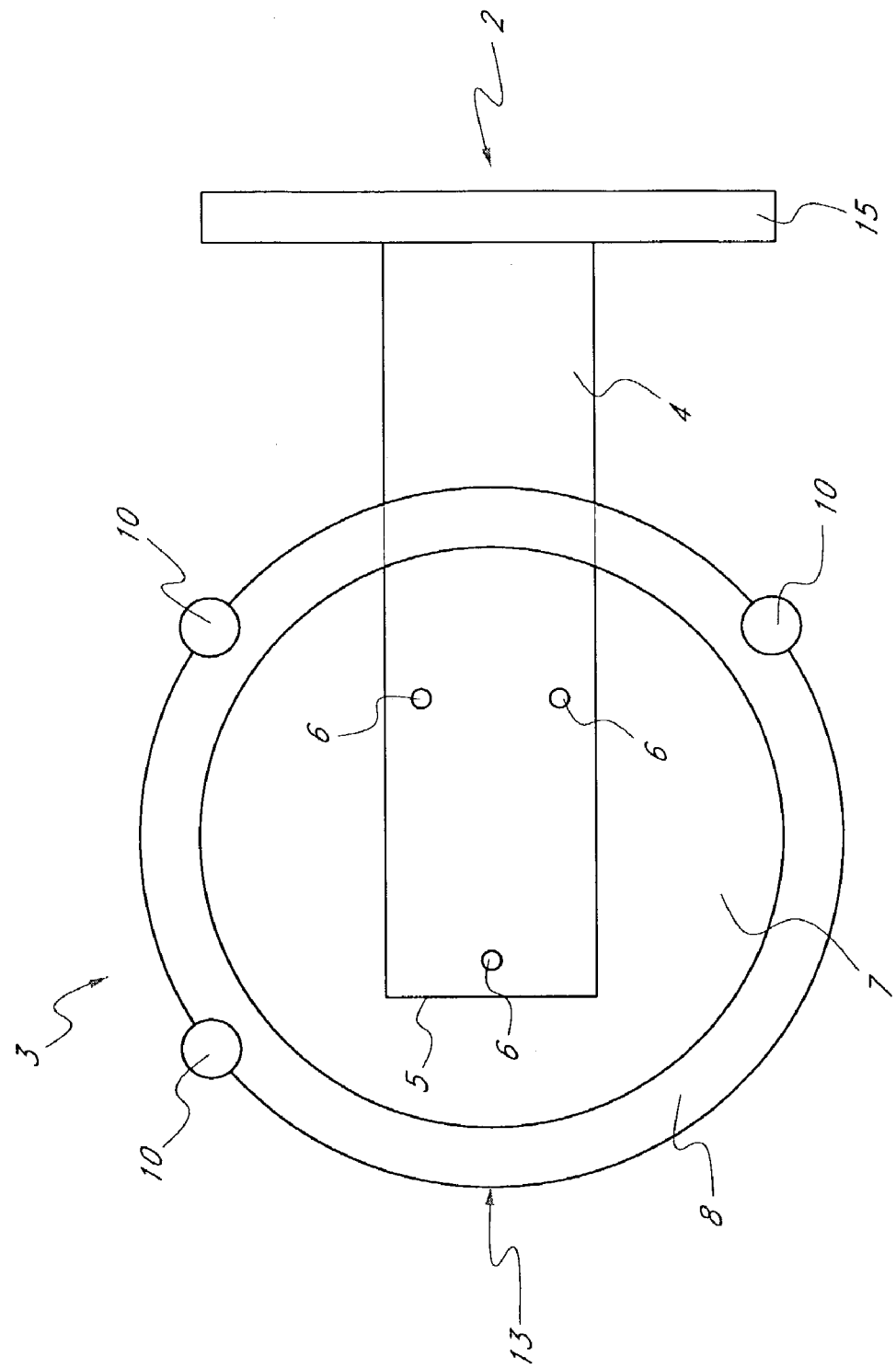
FIG. 4A is a top view taken along lines A—A of FIG. 3 and showing a supporting arm with supporting pins and a wafer holder in the shape of a ring, according to a preferred embodiment of the invention.
Figure 4B:
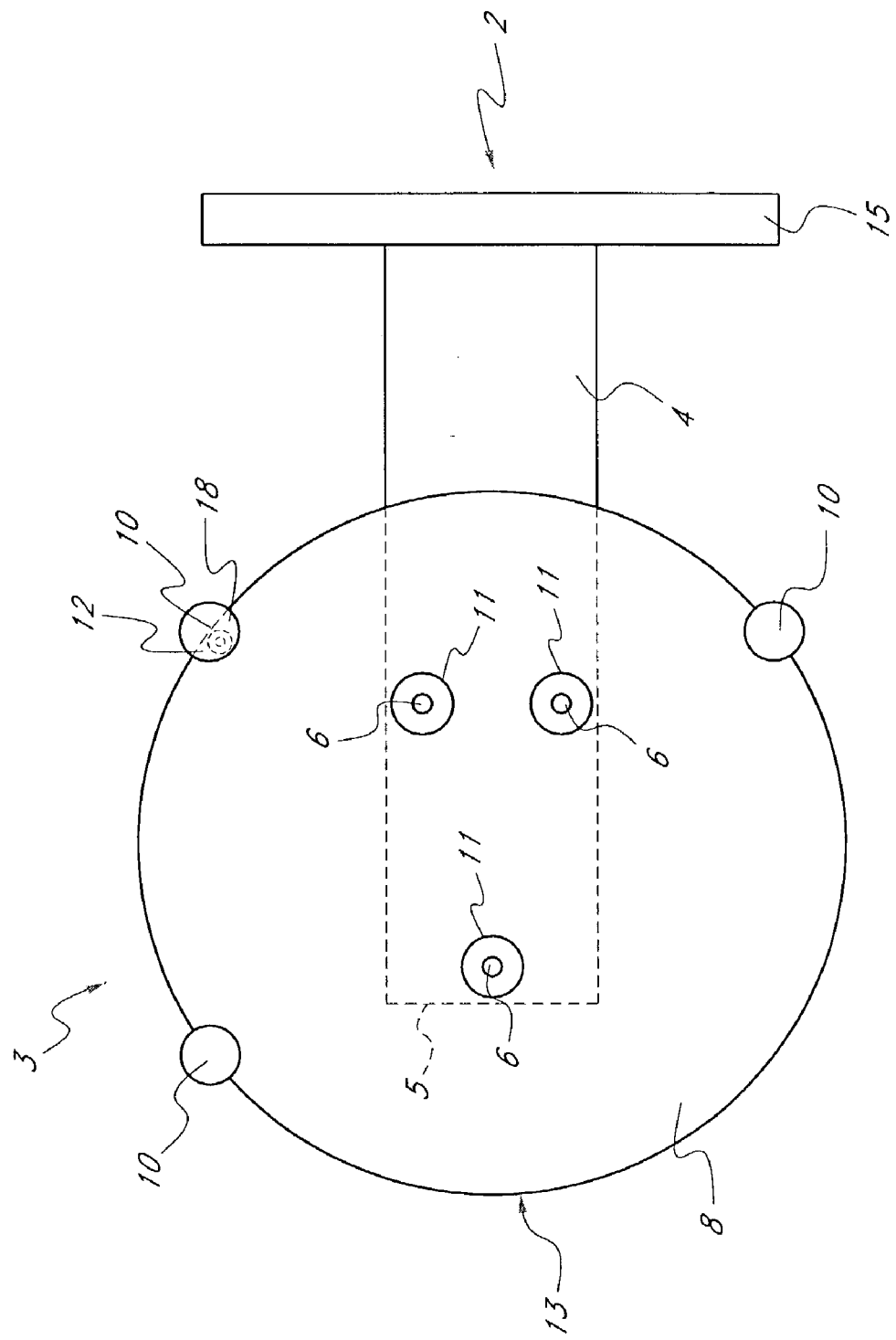
FIG. 4B is a top view similar to that of FIG. 4A, but showing a supporting arm with supporting pins and a wafer holder which is a plate, according to another preferred embodiment of the invention.

The receiver frame 2 comprises a plurality of supporting arms 4 and a vertically extending structure 15 that extends the height of the receiver frame 2 and that interconnects and supports the plurality of supporting arms 4. The supporting arms 4 are preferably coaxially aligned, as discussed below regarding the wafer support structures, and vertically spaced in a manner corresponding with the spacing of the wafer holders 8 in the wafer boat 3. Each supporting arm 4 is configured to be accommodated between a pair of wafer holders 8 held by the boat 3 and to extend with its distal end 5 past the point at which the end 5 would align with the center of the wafer holder 8, as shown in FIGS. 4A and 4B.

While the receiver frame 2 can be used with conventional wafer holders that, e.g., have breaks in their outer perimeter, in the preferred embodiments of the invention the receiver frame 2 is preferably used with wafer holders 8 that are in the shape of a ring (FIGS. 4A and 5A) or with wafer holders 8 that are plates (FIGS. 4B and 5B), both having continuous outer perimeters 13. For wafer holders 8 that are ring-shaped, when a wafer 1 is loaded upon the wafer holder 8, as described below with reference to FIG. 7, the wafer holder 8 preferably extends under the wafer 1 to cover greater than about 10%, preferably greater than about 50% and more preferably greater than about 90% of the bottom surface of the wafer 1. In embodiments where the circumference of the central opening is reduced such that not all pins 6 can be made to protrude through the central opening 7 while also stably supporting an overlying wafer, the support rings 8 can have a plurality of openings that align with and allow passage of the support pins through the rings. In addition, in other embodiments, the wafer holder 8 can have a raised shoulder or edge (not shown) that can shield the edge of a wafer 8 against excessive heat radiation during heat up while undergoing processing, preventing overheating of the that edge.

To temporarily support a wafer 1 (FIG. 6), each supporting arm 4 is provided, proximate its distal end 5, with a wafer support structure that protrudes upwards to support the semiconductor wafer 1. In the illustrated embodiment, the wafer support structure comprises pins 6. Preferably, the supporting arm 4 is provided with at least three supporting pins 6 to stably support a semiconductor wafer. As illustrated in FIGS. 4A and 4B, the distal end 5 of the arm 4 preferably extends beyond a point directly below the center of the wafer holder 8, such that the center of the wafer support structure is substantially coaxially aligned with the center of the wafer holder 8. In being substantially coaxially aligned with the center of the wafer holder 8, the wafer support structure is aligned with a wafer 1 such that the wafer support structure can stably support an overlying wafer 1.

In addition, the wafer support structure protrudes through a central region of the wafer holder 8. By central region, it is meant that the wafer support structure protrudes through the wafer holder 8 at a location that is vertically aligned with an area on the bottom of a wafer 1 that is interior of the outer edge or perimeter 17 of the wafer 1, when the wafer 1 is positioned in the wafer boat 3 at the wafer transfer position. In embodiments where the wafer holder 8 is a ring, the pins 6 preferably can protrude upwardly through the open center 7 of the wafer holder 8 (FIG. 4A). In other embodiments where the wafer holder 8 is a plate, the wafer support structure preferably protrudes upwardly through one or more cut-outs in the wafer holder 8 which are aligned with the wafer support structure. In the embodiment illustrated in FIG. 4B, these cut-outs are preferably holes 11, which are aligned with and allow passage of the wafer support structure or pins 6. Additionally, in preferred embodiments in which the wafer holder 8 is a plate, provided with openings so that pins 6 can pass these openings, a ridge or upward protrusion 12 on one of the vertical extensions, e.g., rods 10, is preferably provided in the accommodation 14 (FIG. 3). Advantageously, the protrusion fits into a hole or indentation 18 in the wafer holder 8 to provide centering and positioning capabilities for aligning the openings in wafer holder 8 with the pins 6.

Figure 5A:
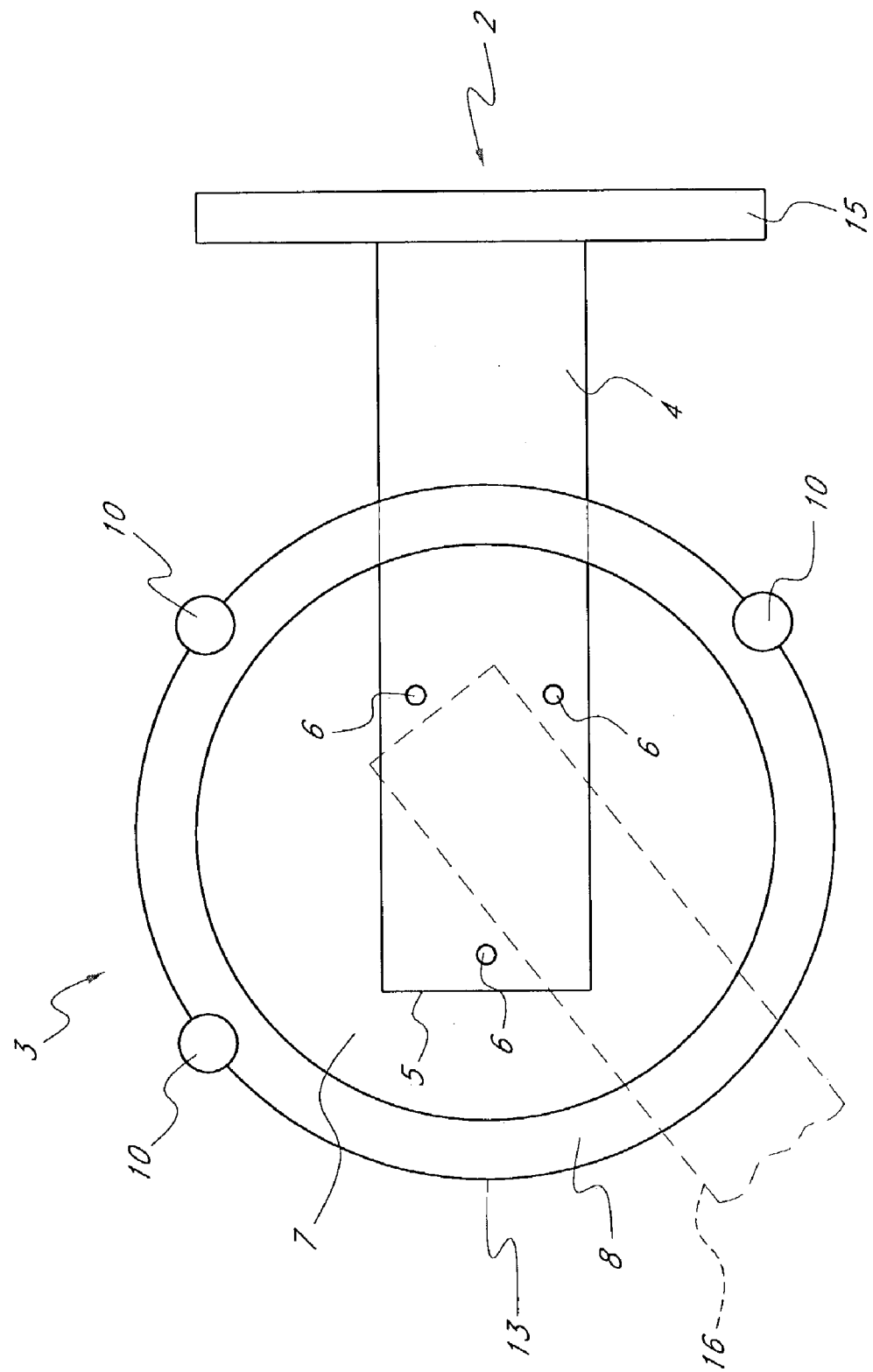
FIG. 5A is a top view similar to that of FIG. 4A, but additionally showing the orientation of an end effector with respect the support pins.
Figure 5B:
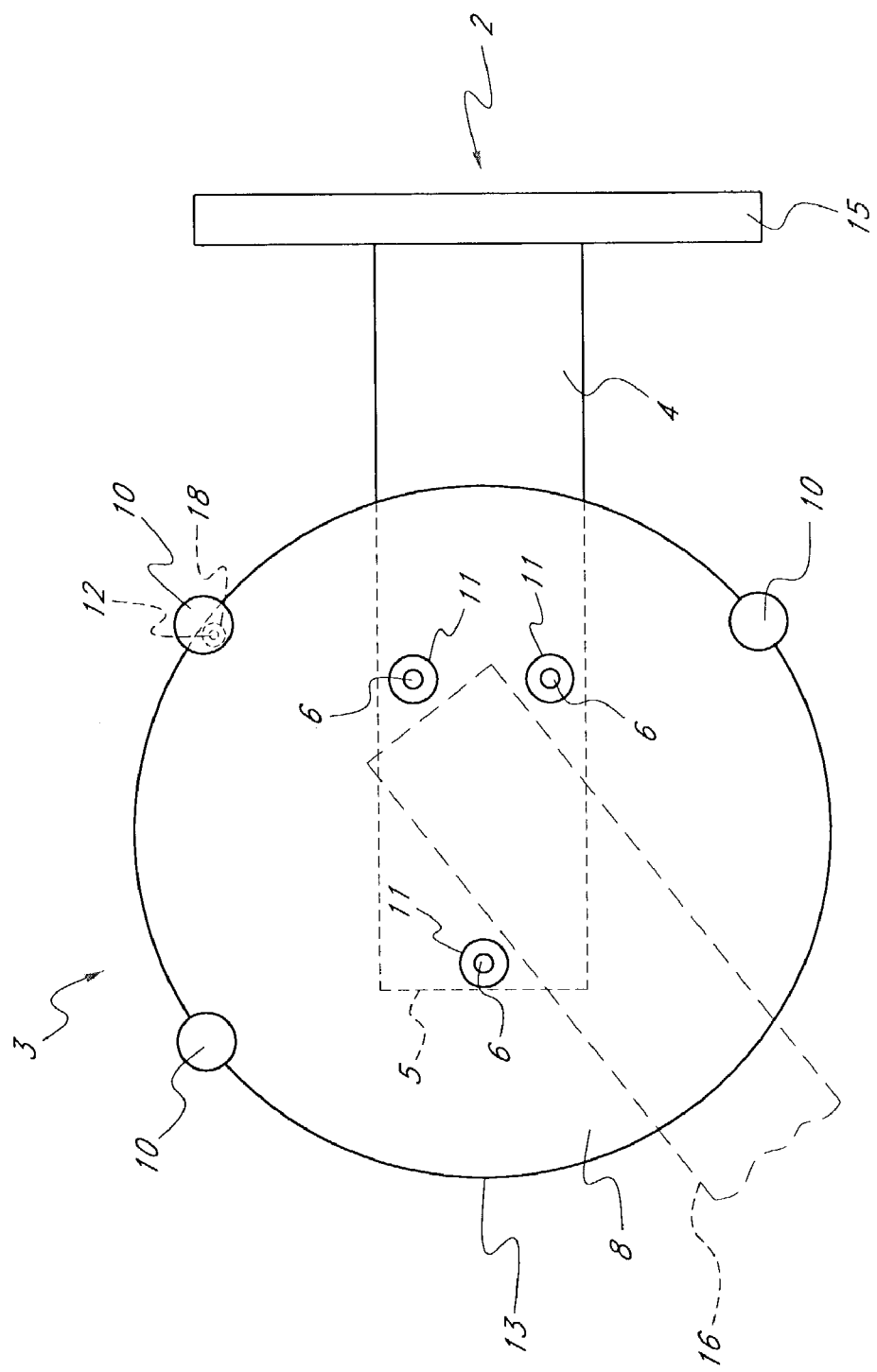
FIG. 5B is a top view similar to that of FIG. 4B, but additionally showing the orientation of an end effector with respect the support pins.

It will also be appreciated that the wafer support structure is spatially arranged to allow an end effector 16 (FIGS. 5A, 5B and 6) to contact the bottom surface of a wafer 1 to deposit the wafer 1 onto the wafer support structure or to lift the wafer 1 off the wafer support structure without the end effector 16 contacting the wafer support structure. For example, in the illustrated embodiment, the end effector 16 can fit and travel between two of the pins 6 that form a line that is most closely orthogonal to the direction of the movement of wafer 1 into and out of the wafer boat 3. In addition, as shown in FIGS. 5A and 5B, it will be appreciated that the end effector 16 enters into the wafer boat 3 from a different direction relative to the support arms 4; that is, the end effector 16 enters the boat 3 from a different side of the boat 3 than do the supporting arms 4. As such, when both the arms 4 and the end effector 16 are inside the boat 3, they form an angle greater than zero relative to each other.

To load wafers 1 onto the wafer holders 8, the receiver frame 2 and the boat 3 are moved relative to each other so that they are arranged in a wafer transfer position, i.e., a position in Which the arms 4 of the receiver frame 2 are positioned between the wafer holders 8 and in which the center of the wafer support structure is directly below and coaxially aligned with the center of the wafer holder 8. At the wafer position, the wafer boat 3 is then moved vertically relative to the receiver frame 2 such that the pins 6 extend above the wafer holders 8, as shown in FIG. 3. A wafer handling device or robot (not shown) then transfers a semiconductor wafer 1 from a wafer container (not shown), which holds wafers before the wafers are loaded into the wafer boat 3, into the wafer boat 3. Preferably, the wafer container is a wafer cassette. The wafer handling device positions the wafer 1 coaxially above the wafer holder 8 and also above the wafer support structure, e.g., the support pins 6. Subsequently, the wafer 1 is positioned on the supporting arm wafer holder structure, e.g., by vertically moving the wafer handling device downward such that the wafer 1 is placed on support pins 6, as shown in FIG. 6. While discussed above as transferring one wafer 1 at a time, it will be appreciated that the wafer handling device can be a device capable of simultaneously transferring a plurality of wafers 1 from a cassette onto the corresponding wafer support structure.

Preferably, the procedure described above is repeated until all supporting arms 4 of the entire receiver frame 2 are occupied with semiconductor wafers 1. Next, the wafers 1 are placed on the wafer holders 8. Preferably, this is accomplished by shifting the receiver frame 2 downward relative to the wafer holders 8 or by shifting the wafer holders 8 upward relative to the receiver frame 2, or by a combination of such movement, so that, as shown in FIG. 7, the wafers 1 are handed-off from the support pins 6 to the wafer holders 8. Preferably, this handing-off or seating of the wafers 1 upon the wafer holders 8 is accomplished by raising the boat 3, such that the wafer holders 8, which preferably rest in the accommodations 14, are all raised simultaneously to contact and then lift the wafers 1 above the pins 6. When the wafer boat 3 is in a position sufficiently high relative to the receiver frame 2, so that the tops of each set of the pins 6 are below the lower surface 9 of the wafer holder 8, the wafer boat 3 can be moved horizontally relative to the receiver frame 2 to a spaced-apart position (not shown), i.e., a position where the receiver frame 2 no longer extends into the boat 3. It will be appreciated that unloading of the wafer boat 3 can be executed by the reverse of the procedure described above. In the preferred loading and unloading sequence, the receiver frame 2 remains stationary and only the wafer boat 3 moves.

Figure 8:
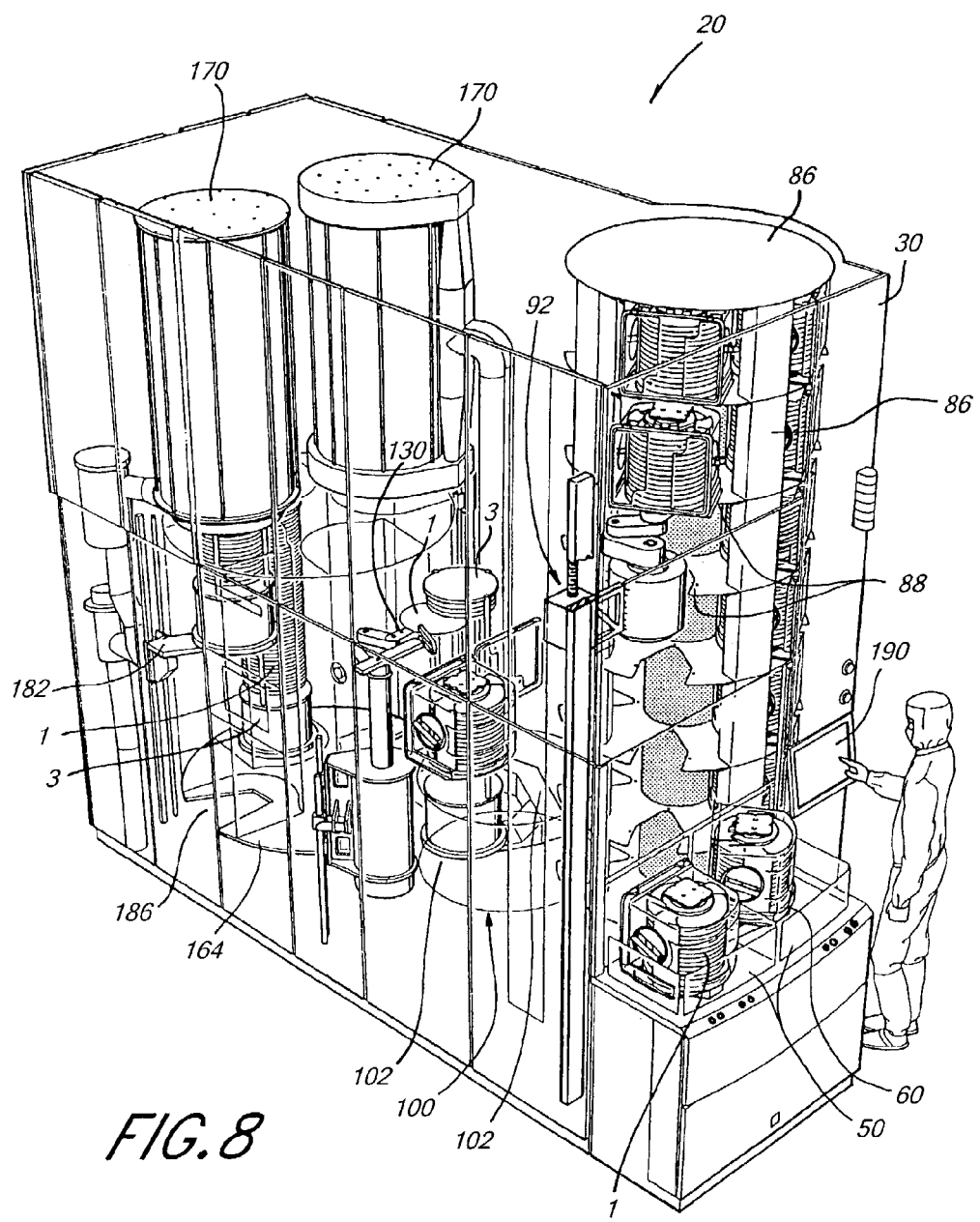
FIG. 8 is a partially exposed perspective view of a preferred heat treatment system configured to batch-wise load semiconductor wafers into a boat, in accordance with preferred embodiments of the invention.
Figure 9:
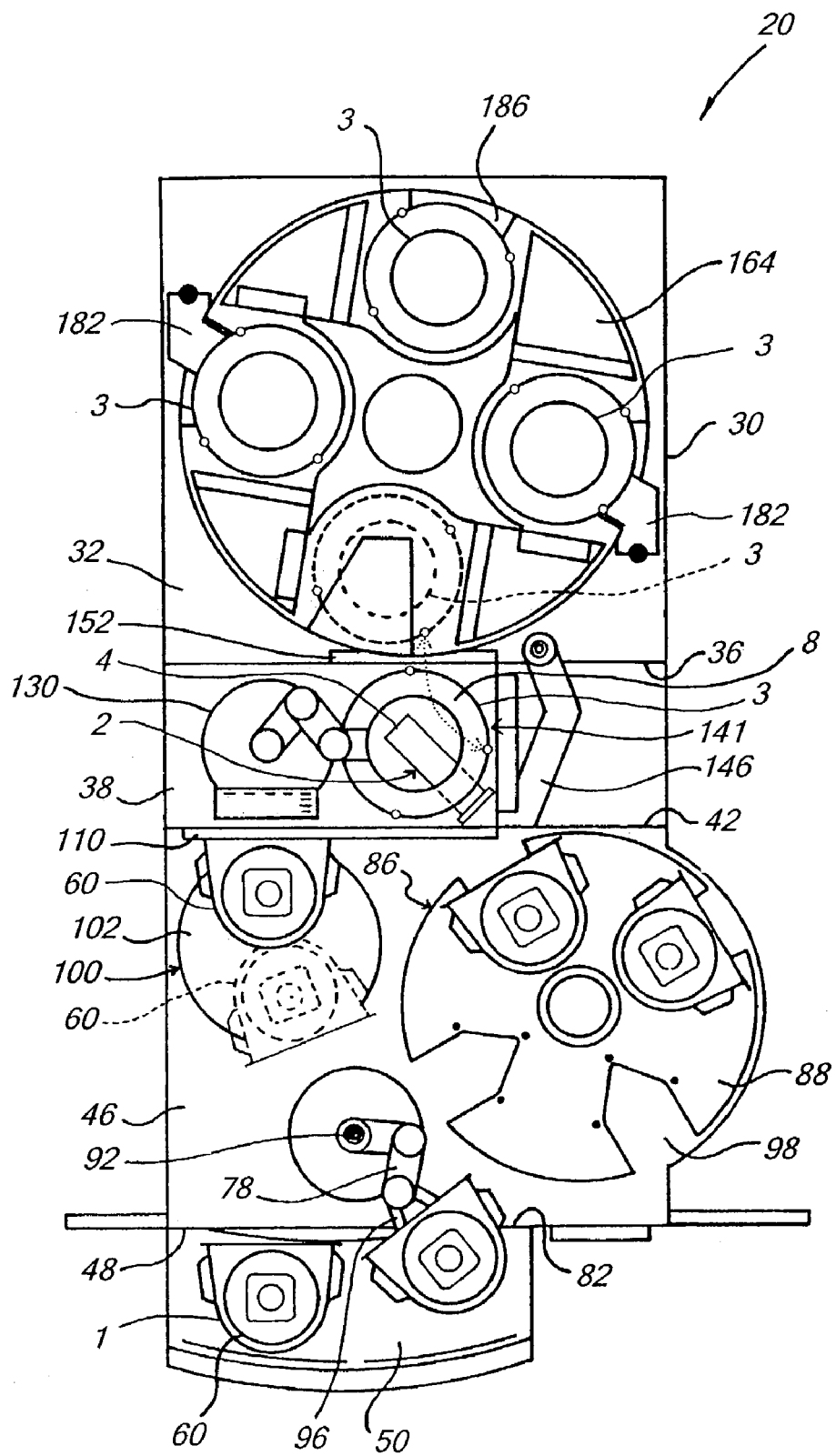
FIG. 9 shows a top view of the heat treatment system of FIG. 8, provided with a receiver frame according to preferred embodiments of the invention.

Advantageously, the preferred embodiments of the invention can be used in a thermal processing system such as that disclosed in U.S. patent application Ser. No. 09/600,695, entitled SYSTEM FOR THE TREATMENT OF WAFERS, filed Jul. 21, 2000 by Sluijk and de Ridder. Representative views of that thermal processing system are shown in FIGS. 8 and 9. The system 20 includes a housing 30 and is installed in a so-called "clean room". The system 20 is also subdivided into a number of chambers 32, 38 and 46. The processing area or chamber 32 is defined within the housing 30 by a first wall or partition 36. A wafer-handling chamber 38 is defined within the housing 30 between the first partition 36 and a second partition 42. A cassette transfer chamber 46 is also defined within the housing 30 between the second partition 42 and a third partition 48. A front end part, which in the illustrated system 20 comprises a cassette loading station 50, is provided on the opposite side of the third partition 48. The cassette loading station 50 facilitates movement of a plurality of cassettes 60 containing wafers 1 into and out of the system 20.

As shown in FIG. 9, according to preferred embodiments of the invention, a receiver frame 22 is provided in the wafer handling chamber 38. The receiver frame 22 is preferably mounted to a wall, such as the partition 42, which is adjacent to the wafer transfer position 141 within the wafer handling chamber 38. In an advantageously mechanically simple embodiment, the receiver frame 22 is preferably immovably mounted on the partition 42; that is, the receiver frame 22 is not connected to any mechanical actuators, such that the position of the receiver frame 22 is fixed and does not move independent of the partition 42. In addition, as discussed above, frame 22 comprises a plurality of supporting arms 4, which are coaxially aligned and vertically spaced in a manner corresponding with the spacing of the rings 8 in the wafer boat 3 (FIGS. 3–6).

To operate the processing system 20, an operator, shown diagrammatically in FIG. 8, loads cassettes 60 onto the cassette loading station 50 of the system 20. Processing instructions are input by the operator to a controller (not shown) of the system 20 at a control panel 190. The cassette handling device 78 transports the cassettes 60 from the loading station 50 and places each cassette 60 in each of a number of storage compartments 88 provided in the store 86. The store 86 can be rotated to present additional compartments 88 to be filled by the cassette handling device 78.

Preferably, the cassettes 60 are standard front-opening unified pods ("FOUPs"), which have doors that can be closed to provide sealed environments for the wafers 1 and which can be opened to provide access to the wafers 1. The FOUPs typically hold 25 wafers 1, although it will be appreciated that greater or fewer numbers of wafers 1 can be held, depending upon the physical layout and size of the FOUP and associated processing equipment. A cassette handling device 78 is provided in the cassette transfer chamber 46 to transport the cassettes 60 from the loading station 50 through a closable opening 82 to the cassette store 86. In the illustrated embodiment, the cassette store 86 comprises a number of vertically aligned rotary platforms 88 on which the cassettes 60 can be supported. The cassette-handling device 78 is movable in a vertical direction by means of an elevator 92 so that the various platforms 88 of the cassette store 86 can be accessed by the cassette-handling device 78.

The cassette handling device 78 includes a cassette end effector 96 which, in the embodiment shown, has dimensions slightly smaller than the dimensions of a plurality of cut-outs 98 provided in the rotary platforms 88. The cassette-handling device 78 is operable to transport the cassettes 60 between the cassette loading station 50 and the store 86. The end effector 96 can be lowered or raised through the cut-outs 98 of the platforms 88 to lower the cassettes 60 onto, or raise the cassettes 60 off of, the platforms 88.

In the illustrated arrangement, a rotatable cassette transfer platform 100 is provided adjacent to the partition 42 between the cassette transfer chamber 46 and the wafer-handling chamber 38. The cassette transfer platform 100 of the illustrated embodiment includes two levels 102 (FIG. 8) which can be rotated independently of one another. The cassette handling device 78 is adapted to transport the cassettes 60 between the store 86 and the cassette transfer platform 100. Alternatively, the cassette handling device 78 can transport the cassettes 60 directly between the cassette loading station 50 and the cassette transfer platform 100, bypassing the store 86. The transfer platform 100 can be rotated so that the doors of the cassettes 60 are positioned against an interface portion 110 of the partition 42. The interface portion 110 of the partition 42 preferably includes closable openings (not shown) through which the cassettes 60 can be accessed.

As illustrated in FIG. 9, a wafer handler 130 is provided in the handling chamber 38. The wafer handler 130 is adapted to transfer wafers 1 between the cassettes 60, positioned against the interface portion 110 of the partition 42, and a wafer boat 3. In the illustrated embodiment, the wafer boat 3 is situated in the wafer handling chamber 38 adjacent to the wafer handler 130. The wafer boat 3 preferably holds more than about 50 wafers, and in the illustrated embodiment holds 100 wafers 1. While illustrated transferring one wafer 1 at a time, it will be appreciated that the wafer handling device 130 can be converted into a device which can simultaneously transfer two or more wafers 1 from a cassette 60 to a corresponding number of supporting arm wafer support positions, i.e., positions in which the wafers 1 are supported on pins 6 and coaxially aligned above wafer holders 8. It will also be appreciated that the wafer handler 130 and the receiver frame 22 are independent of each other; that is, the receiver frame 22 is not a constituent part of the wafer handling robot 130.

A transfer arm or mechanism 146 is provided adjacent to the wafer boat 3. The transfer arm 146 is adapted to move the wafer boat 3 between the handling chamber 38 and the processing chamber 32 through a closable opening 152 provided in the partition 36.

For transferring wafers from a cassette 60 to a boat 3 (or vice versa), the transfer arm 146 is capable of moving the boat 3 to the wafer transfer position 141. In the wafer transfer position 141, the transfer arm 146 positions the boat 3, relative to the receiver frame 22, such that the distal end of the supporting arm 4 of the frame 2 is positioned below and extending slightly beyond the center of a wafer holder 8. Further, the transfer arm 146 is capable of lowering the boat 3 so that the support pins 6 of supporting arms 4 extend sufficiently above the rings 8 so that wafer handler 130 can load wafers onto the support pins 6 without touching the wafer holders 8, as shown in FIG. 6. It will be appreciated that instead of moving the boat in a downward direction, a similar relative spatial arrangement of the support pins 6 and wafer holders 8 can be achieved by moving the receiver frame 2 in an upward direction while keeping the boat stationary. Subsequently, to load the boat 3, the wafer handler 130 transfers the wafers 1 from the cassette 60 and loads them onto the support pins 6 of the supporting arms 4 of the receiver frame 2.

After loading of wafers 1 onto supporting pins 6 has been completed, the closure 152 in the partition 36 is opened. The transfer arm 146 lifts the boat 3 vertically over a distance sufficient to hand-off the wafers 1 from the supporting pins 6 onto the rings 8. Lifting of the boat 3 continues until the tops of a set of pins 6 clears the lower surface 9 of a wafer holder 8 directly above the set of pins 6 (FIG. 7). Then, the transfer arm 146 moves the boat 3 in a horizontal direction from the wafer transfer position in the handling chamber 38 to a position spaced apart from the receiver frame 22. In the illustrated arrangement, the transfer arm 146 moves the boat 3 into the processing chamber 32 and places the boat 3 onto a horizontal boat transfer mechanism, illustrated as a carousel 164. Thus, as shown in FIG. 9, the spaced-apart position can, e.g., include having the boat 3 in the processing chamber 32 and while keeping the receiver frame 2 in the wafer-handling chamber 38.

For semiconductor processing, as illustrated in FIG. 8, a pair of vertical furnaces 170 is provided above the carousel 164. The carousel 164 is rotated to move the boat 3 from a position adjacent the wafer-handling chamber 38 to a position beneath one of the furnaces 170. A lift arm 1.82 is provided below each of the furnaces 170 to raise and lower the wafer boats 3 into and out of the furnaces 170. Cut-outs 186 are provided in the carousel 164 for passage of the lift arm 182 as the boats 3 are lifted off from and lowered back onto the carousel 164.

After processing, the lift arm 182 lowers the boat 3 back onto the carousel 164. The processed wafers 1 may then be cooled at another position on the carousel 164, as necessary, prior to removing the boat 3 from the processing chamber 32. When the wafers 1 are sufficiently cool, the closure 152 in the partition 36 is again opened and the transfer arm 146 can move the boat 3 back into the handling chamber 38 and into a wafer transfer position 141 for unloading the wafers 1 using the receiver frame 2.

It will be appreciated that unloading of the wafers 1 from the wafer boat can be performed by reversing the loading procedure described above. The wafers 1 can be unloaded from the boat 3 by the wafer handler 130 and transferred to an empty cassette 60 that is positioned on the other side of the interface portion 110 of the partition 42.

Although the present invention has been described with reference to the illustrated examples, in other embodiments, various illustrated features can be changed. For example, a different processing chamber, such as one comprising a smaller or larger number of reactors, might be used. Furthermore, a different mechanism for transferring boats can be used, so long as the mechanism can position the boat in a wafer transfer position. Also, instead of mounting the receiver frame such that it remains stationary, the receiver frame can be provided with an actuator to move it vertically, to transfer, or hand-off, wafers from the support pins to the wafer holders (e.g., rings or plates) or vice versa. Additionally, instead of the wafer boat being moved horizontally while the receiver frame remains stationary, in other arrangements, after loading, the receiver frame is moved away from the wafer boat, which may be directly below a semiconductor processing furnace.

Moreover, while in the illustrated embodiment the receiver frame has a plurality of arms connected to a vertically extending structure, in other embodiments the vertically extending structure need not be an element separate from the already pre-existing elements of a processing system. For example, in embodiments in which the receiver frame does not move vertically to hand-off wafers to wafer holders, the supporting arms may simply be individually mounted to a vertically extending surface such as a wall or a partition of a transfer chamber. In such embodiments, the receiver frame comprises the supporting arms and the vertically extending surface, with the vertically extending surface acting as the vertically extending structure. Also, instead of support pins on the support arms, a different wafer support structure might be provided on the distal end of the receiving arms 4. For example, two curved support ridges, which contact a wafer at a central region of its backside or bottom surface, can also be used as the wafer support structure. In addition, while the supporting arms 4 are illustrated as rectangle plates, in other embodiments the supporting arms need not be plates or rectangular in shape. Rather, other suitable supporting arms include structures that are able to fit between the rings of a wafer boat and that have support structures suitable for supporting a wafer for loading and unloading as described herein. For example, the support arms can be a trapezoidal or curved plate, or can be a plurality of horizontally extending rods, each rod comprising, e.g., a wafer support structure.

Similarly, it will be appreciated that various other omissions, additions and modifications may be made to the processes and apparatus described above without departing from the scope of the invention. All such modifications and changes are intended to fall within the scope of the invention, as defined by the appended claims.

I claim:

1. A system for transferring a plurality of semiconductor wafers, comprising:
    a vertical wafer boat;
    a plurality of wafer holders in the wafer boat, wherein the wafer holders are vertically spaced apart and wherein each wafer holder is configured to extend continuously around a perimeter of one of the plurality of wafers when the wafer is seated upon the wafer holder;
    a wafer handler provided with an end effector;
    a receiver frame independent of the wafer handler, wherein the receiver frame comprises a plurality of vertically spaced supporting arms, wherein each of the supporting arms comprises an upwardly projecting wafer support structure, the wafer support structure immobile relative to the supporting arm from which the wafer support structure projects, wherein the wafer support structure is configured to support one of the plurality of wafers while vertically spacing the wafer from one of the plurality of wafer holders directly below the wafer, wherein a height and spatial arrangement of the wafer support structure is sufficient to allow the end effector to contact a bottom surface of the wafer without the end effector contacting the wafer holder or the wafer support structure; and
    a transfer mechanism, the transfer mechanism capable of moving the wafer boat and the receiver frame relative to each other from a spaced-apart position to a wafer transfer position,
    wherein each supporting arm, including its wafer support structure, is sized and vertically spaced from other supporting arms such that the plurality of supporting arms can be accommodated between the plurality of wafer holders, each supporting arm accommodated directly below a wafer holder.

2. The system of claim 1, wherein the wafer support structures on each support arm define a circle, wherein a center of the circle substantially coaxially aligns along a vertical axis with centers of the plurality of wafer holders when the wafer boat is positioned at the wafer transfer position.

3. The system of claim 1, wherein the wafer support structure of each supporting arm comprises at least three pins.

4. The system of claim 1, wherein each of the plurality of wafer holders is a plate.

5. The system of claim 4, wherein the plate comprises at least three openings, the three openings allowing vertical passage of the wafer support structure.

6. The system of claim 1, wherein a shape of each of the plurality of wafer holders from a top view is a ring.

7. The system of claim 6, wherein each ring comprises at least one opening, the at least one opening allowing vertical passage of the wafer support structure of each of the supporting arms.

8. The system of claim 1, wherein the wafer boat comprises a vertical extension, the vertical extension extending the height of the wafer boat.

9. The system of claim 8, wherein the vertical extension comprises at least three rods.

10. The system of claim 9, wherein each of the at least three rods comprises a upwardly facing surface for supporting one of the plurality of wafer holders.

11. The system of claim 1, wherein the upwardly facing surface is a recess in the rod.

12. The system of claim 1, wherein the receiver frame comprises a vertically extending structure for supporting and spacing the supporting arms, wherein the supporting arms are directly fixed to the vertically extending structure.

13. The system of claim 12, wherein the receiver frame is immovably mounted on a vertically extending surface.

14. The system of claim 13, wherein the vertically extending surface is a wall of a transfer chamber.

15. The system of claim 1, wherein the receiver frame is immovable horizontally and wherein the transfer mechanism is configured to move the wafer boat horizontally and to move the receiver frame vertically relative to the wafer boat.

16. The system of claim 1, further comprising a wafer transfer chamber configured for transferring wafers from a wafer cassette to the wafer boat, wherein the wafer transfer position is located in the wafer transfer chamber.

17. The system of claim 16, further comprising a process chamber for subjecting wafers to semiconductor fabrication processes, wherein the process chamber is adjacent to the wafer transfer chamber and wherein the spaced-apart position comprises the wafer boat located in the process chamber and the receiver frame located in the wafer transfer chamber.

18. An apparatus for transferring a plurality of semiconductor wafers to a wafer boat having a plurality of wafer holders, comprising:
  a vertically extending structure;
  a plurality of horizontally extending supporting arms attached to the vertically extending structure, wherein the supporting arms are sized and vertically spaced to fit between adjacent wafer holders in the wafer boat and wherein each of the plurality of supporting arms is immovable relative to other of the plurality of supporting arms and wherein each of the supporting arms is provided with a wafer support structure extending upwardly from the support arm and configured to extend upwardly through a central region of a directly overlying wafer holder and configured to support a wafer directly above the wafer holder while extending upwardly through the central region, wherein the wafer support structure is immobile relative to the supporting arm from which the wafer support structure extends upward.

19. The apparatus of claim 18, wherein the vertically extending structure is a vertically extending rectangular plate.

20. The apparatus of claim 19, wherein each of the supporting arms comprises a horizontally extending rectangular plate.

21. The apparatus of claim 20, wherein each of the supporting arms wafer support structures comprises three pins.

22. A method of transferring semiconductor wafers between a wafer container and a wafer boat, comprising:
  providing a wafer boat having a plurality of wafer holders for supporting wafers during semiconductor processing;
  providing a receiver frame having a plurality of supporting arms, each supporting arm immovable relative to other of the plurality of supporting arms and provided proximate its distal end with a wafer support structure, the wafer support structure configured to allow a wafer supported by the wafer support structure to be contacted by an end effector at a bottom surface of the wafer without the end effector contacting the wafer support structure or any of the plurality of wafer holders, wherein the wafer support structure is immobile relative to the supporting arms;
  horizontally moving the wafer boat and the receiver frame relative to each other to place each of the plurality of supporting arms between pairs of adjacent wafer holders and to approximately align the wafer support structures with a center of a directly overlying wafer holder;
  positioning a top surface of the wafer support structure of each of the supporting arms above a wafer holder directly overlying the supporting arm;
  placing a wafer from the wafer container onto one of the wafer support structures;
  seating the wafer upon the wafer holder by vertically shifting the wafer boat and the receiver frame relative to each other; and
  horizontally distancing the wafer boat from the receiver frame after lifting the wafer.

23. The method of claim 22, wherein seating the wafer comprises vertically lifting the wafer boat while the plurality of wafers remains stationary.

24. The method of claim 22, wherein horizontally moving the wafer boat comprises moving the wafer boat from a first chamber to a second chamber, the first chamber and the second chamber separated by a partition.

25. The method of claim 24, wherein the first chamber is a process chamber configured for subjecting wafers to semiconductor fabrication processes and the second chamber is a transfer chamber configured for transferring wafers to a wafer boat.

26. The method of claim 24, wherein horizontally distancing the wafer boat comprises moving the wafer boat from the second chamber to the first chamber.

27. The method of claim 22, wherein horizontally moving the wafer boat and horizontally distancing the wafer boat are performed using a single transfer mechanism.

28. A method of transferring semiconductor wafers, comprising:
  providing at least two wafers in a wafer cassette;
  providing at least two wafer holders in a wafer boat;
  providing at least two horizontally extending arms;
  providing a wafer handler;
  horizontally inserting the arms into the wafer boat;
  inserting each of the wafers into the wafer boat above one of the wafer holders using the wafer handler, wherein the wafer and the arms are each inserted into the wafer boat from a different direction relative to each other;
  supporting each of the wafers above and vertically separated from the wafer holder with one of the arms after inserting each of the wafers; and
  subsequently seating each of the wafers upon one of the wafer holders by simultaneously lowering each of the horizontally extending arms relative to the at least two wafer holders, wherein each of the wafer holders extends continuously around a perimeter of one of the wafers seated upon the wafer holder.

29. The method of claim 28, wherein simultaneously lowering each of the horizontally extending arms relative to the at least two wafer holders comprises vertically raising the at least two wafer holders while the at least two horizontally extending arms remains stationary.

30. The method of claim 28, wherein horizontally inserting the arms into the wafer boat comprises horizontally moving the wafer boat while the arms remain stationary.

31. A method of transferring a plurality of wafers onto a plurality of wafer holders in a vertical wafer boat, comprising:
  positioning each of the plurality of wafers above one of the plurality of wafer holders;

supporting the plurality of wafers vertically separated from each of the plurality of wafer holders after positioning;

seating each of the plurality of wafers upon one of the plurality of wafer holders by raising the wafer boat, wherein each of the plurality of wafer holders supporting a wafer extends continuously around an outer edge of the wafer after seating.

32. The method of claim 31, wherein positioning each of the plurality of wafers comprises moving one wafer at a time to a position above one of the plurality of wafer holders.

33. The method of claim 31, further comprising horizontally moving the wafer boat before positioning each of the plurality of wafers.

* * * * *

UNITED STATES PATENT AND TRADEMARK OFFICE
CERTIFICATE OF CORRECTION

| | |
|---|---|
| PATENT NO. | : 7,033,126 B2 |
| APPLICATION NO. | : 10/406801 |
| DATED | : April 25, 2006 |
| INVENTOR(S) | : Jannes Van den Berg |

It is certified that error appears in the above-identified patent and that said Letters Patent is hereby corrected as shown below:

Page 2 Column 1 (U.S. Patent Documents); Line 7; After "6,321,680" delete "B1" and insert --B2--, therefor.

Column 5; Line 7; Delete "hte" and insert --the--, therefor.

Column 7; Line 59; Delete "Which" and insert --which--, therefor.

Column 10; Line 60; Delete "1.82" and insert --182--, therefor.

Signed and Sealed this

Twenty-third Day of January, 2007

JON W. DUDAS
*Director of the United States Patent and Trademark Office*